United States Patent
Nguyen et al.

[11] Patent Number: 6,027,968
[45] Date of Patent: Feb. 22, 2000

[54] ADVANCED DAMASCENE PLANAR STACK CAPACITOR FABRICATION METHOD

[75] Inventors: Son Van Nguyen, San Jose, Calif.; Matthias Ilg, Fishkill, N.Y.; Kevin J. Uram, Union City, Calif.

[73] Assignees: International Business Machines Corporation, Armonk, N.Y.; Siemens Aktiengesellschaft, Munich, Germany; Lam Research Corporation, Fremont, Calif.

[21] Appl. No.: 08/975,193

[22] Filed: Nov. 20, 1997

Related U.S. Application Data

[62] Division of application No. 08/752,137, Nov. 19, 1996.

[51] Int. Cl.[7] ............................................... H01L 21/8242
[52] U.S. Cl. ................................................................ 438/254
[58] Field of Search ................................. 438/238, 239, 438/253–256, 381, 396–399

[56] References Cited

U.S. PATENT DOCUMENTS

| | | | |
|---|---|---|---|
| 5,153,813 | 10/1992 | Oehrlein et al. | 361/313 |
| 5,155,657 | 10/1992 | Oehrlein et al. | 361/313 |
| 5,160,987 | 11/1992 | Pricer et al. | 257/307 |
| 5,170,233 | 12/1992 | Liu et al. | 156/662 |
| 5,223,729 | 6/1993 | Kudoh et al. | 257/296 |
| 5,240,871 | 8/1993 | Doan et al | 437/47 |
| 5,262,662 | 11/1993 | Gonzalez et al. | 257/307 |
| 5,376,233 | 12/1994 | Man | 257/308 |
| 5,409,856 | 4/1995 | Jun | 437/52 |
| 5,436,186 | 7/1995 | Hsue et al. | 437/52 |
| 5,460,999 | 10/1995 | Hong et al. | 437/60 |
| 5,656,536 | 8/1997 | Wu | 438/397 |

OTHER PUBLICATIONS

C. Koburger, III, et al.; A Half–Micron MOS Logic Generation; IBM J. Res. Develop., vol. 39, No. 1/2; Jan./Mar. 1995; pp. 215–227.

E. Adler, et al.; The Evolution of IBM CMOS DRAM Technology; IBM J. Res. Develop., vol. 39 No. 1/2; Jan./Mar., 1995; pp. 167–187.

*Primary Examiner*—Joni Chang
*Attorney, Agent, or Firm*—Whitham, Curtis & Whitham; Daryl K. Neff

[57] ABSTRACT

Capacitor storage charge can be increased by increasing storage node area. A high aspect surface ratio stack capacitor is produced without increasing overall cell dimensions. The node is formed with layers of low doped and high doped concentration borophosphosilicate glass which is deposited by a single process step with precise nanometer dimensions, are selectively etched so that either doped or undoped layers will have a higher etch rate. This etching creates finger-like projections in the node, which provide for greater surface area using a very simplified process requiring fewer processing steps.

9 Claims, 4 Drawing Sheets

ADVANCED DAMASCENE PLANAR STACK CAPACITOR FABRICATION METHOD

This application is a divisional of Ser. No. 08/752,137, filed Nov. 19, 1996.

BACKGROUND OF THE INVENTION

1. Field of the Invention

The present invention generally relates to fabrication of Dynamic Random Access Memory (DRAM) cells and, more particularly, to increasing capacitor storage for DRAM cells.

2. Background Description

Increased capacitor charge storage is critical in future DRAM cells. One way to achieve this objective is to increase the area of the storage node. This must be accomplished without increasing the overall cell dimension for a given dielectric thickness. Many suggestions have been proposed in the literature to increase the capacitor area in DRAM cells such as a corrugated capacitor structure, a three dimensional capacitor structure, a pillar in trench structure, a rough polysilicon structure, and a ring structure. Some of the drawbacks of these proposals are that complex multi-processing steps increase processing costs of the microelectronic device and decrease device yield and that it is very difficult to control the structure and multi-layer film at nanometer dimensions. Diffusion controls film roughness. As a result, the process will not be able to extend in the nanometer scale dimension.

In the past, damascene metal interconnect and planarization processes had been developed and used for Back End of the Line (BEOL) metal wiring for microelectronic devices (IBM Journal of Research and Developments, Vol. 39, No. 1, January 1995, pp. 167–188 and IBM Journal of Research and Developments, Vol. 39, No. 2, March 1995, pp. 215–227).

SUMMARY OF THE INVENTION

It is therefore an object of the present invention to provide a simple damascene fabrication process for high aspect surface area ratio for stack capacitor structure suitable for gigabit DRAM device.

According to the invention, capacitor storage charge is increased by increasing storage node area. A high aspect surface ratio stack capacitor is produced without increasing overall cell dimensions. The node is formed with layers of low doped and high doped concentration borophosphosilicate glass which can be deposited by a single process step with precise nanometer dimensions. These layers are selectively etched so that either doped or undoped layers will have a higher etch rate. This etching creates finger-like projections in the node, which provide for greater surface area using a very simplified process requiring fewer processing steps.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
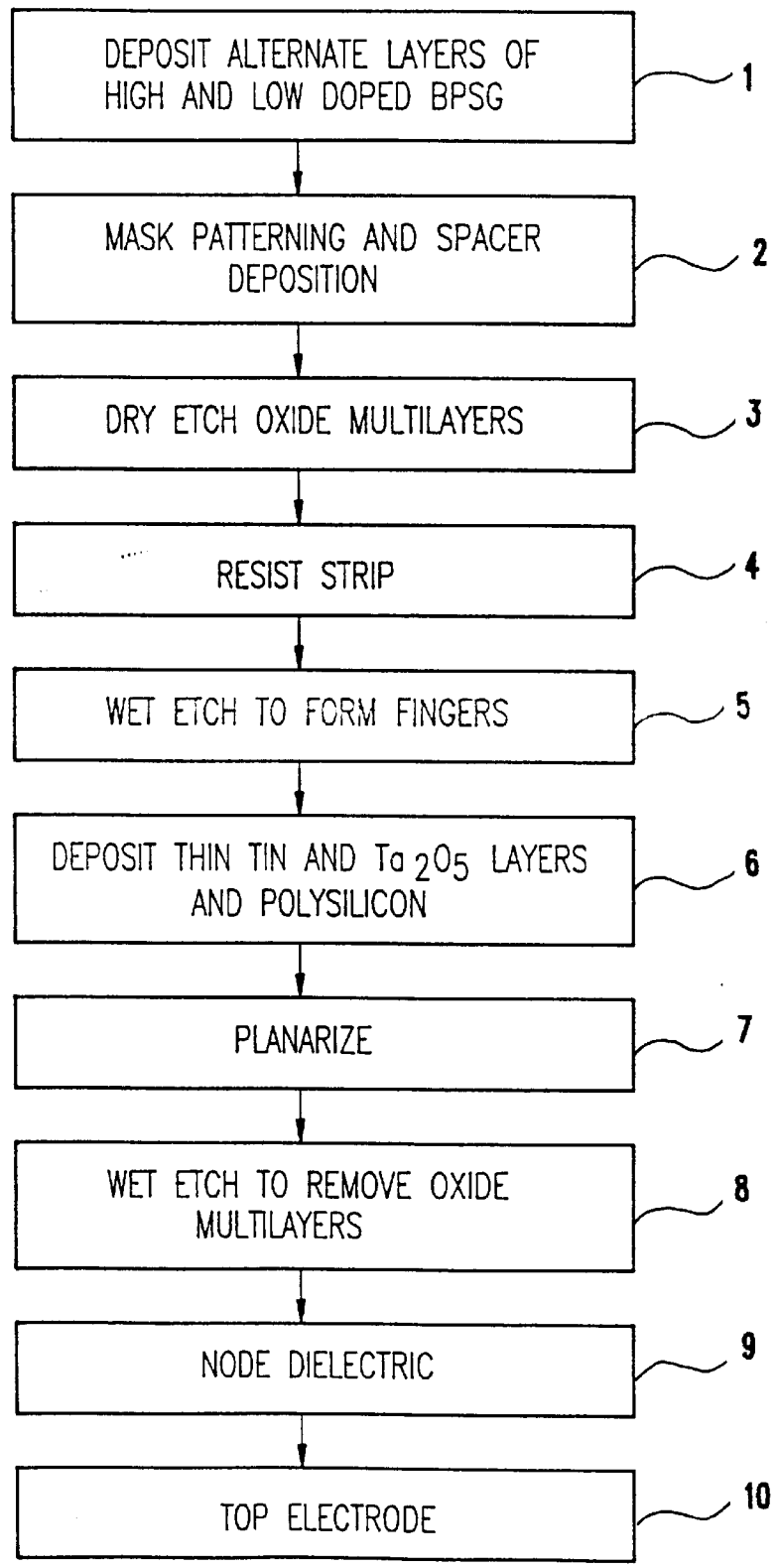
FIG. 1 is a flow chart of the steps of the invention.
Figure 2:
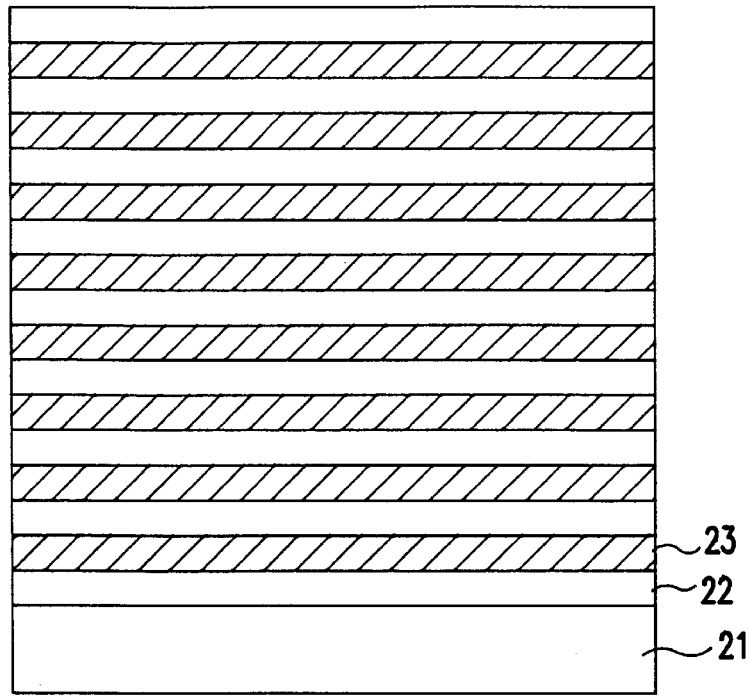
FIG. 2 is a schematic of a cross section of the structure as it appears after the first step of the inventive process.

Referring now to the drawings, and more particularly to FIG. 1, there is shown a flow chart of the steps of the inventive method. First, as shown in block 1, a borophosphosilicate glass (BPSG) layer is deposited by low pressure chemical vapor deposition (LPCVD) with a modulation of dopant concentration of phosphorous by a single deposition step. A cross section showing this is shown in FIG. 2. Such layers can be obtained in a chemical vapor deposition (CVD) reactor of multi-gas outlets such as the Lam Integrity 9800. Other CVD reactors of similar configuration can also be used for the BPSG film deposits. The preferred temperature range is 725° C. to 750° C., but the required modulation of the dopant concentration can be obtained at any temperature below 800° C.

As can be seen in FIG. 2, there are a substrate 21 and multiple layers of alternating low 22 and high 23 dopants (boron and phosphorous) BPSG films. The concentration of a dopant may range from about 0.1% to about 10% by weight for each dopant. The BPSG film could have a total dopant concentration of about 20% by weight with about 10% by weight of phosphorous and 10% by weight of boron. A low dopant concentration layer may have a concentration range of less than 0.5% to about 1% by weight and a high dopant concentration layer may have a concentration range of about 3% to about 10% by weight. The layers can be BPSG, phosphosilicate glass (PSG), or borosilicate glass (BSG) films. The thickness of the layers may range from about 1 to about 1000 nm.

Next, as indicated by block 2 of FIG. 1, the product is mask patterned. Plasma enhanced chemical vapor deposition (PECVD) film deposited at low temperature (<300° C.) can be used to form spaces to reduce dimensions of the lithography opening. The film can be deposited using the referenced plasma CVD system with $SiH_4 + NH_3 + N_2$ reactants. The top nitride film is then etched off leaving spacer behind.

In the step shown in block 3, the BPSG is then reactive ion etched (RIE). In the step shown in block 5, wet etching is then done to form a fingered structure. Any wet etch solution can be used for which the BPSG etch rate depends on the boron and phosphorous dopant content.

Figure 3A:
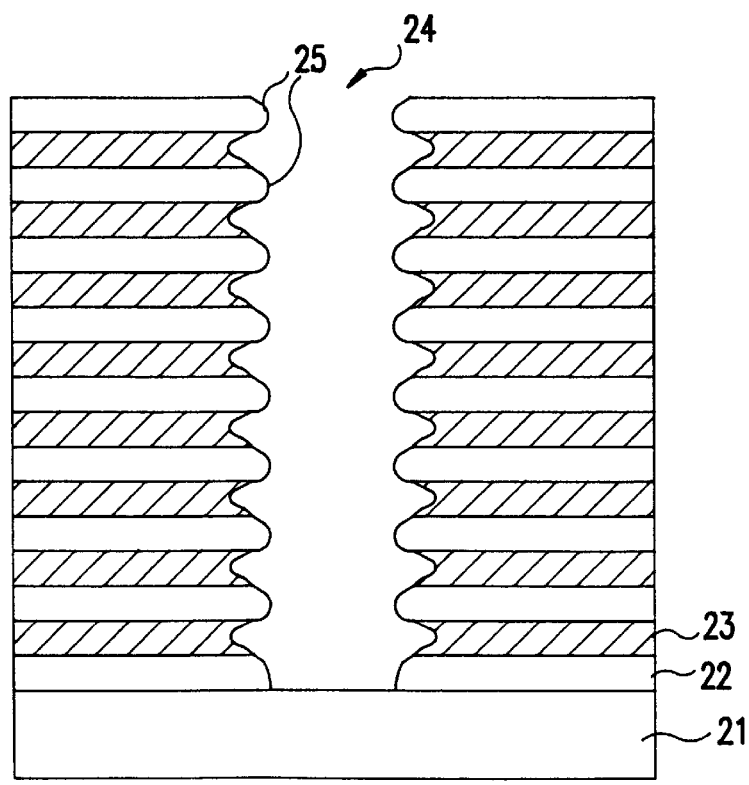
FIG. 3A is a schematic of a cross section of the structure as it appears after the fourth step of the inventive process.
Figure 3B:
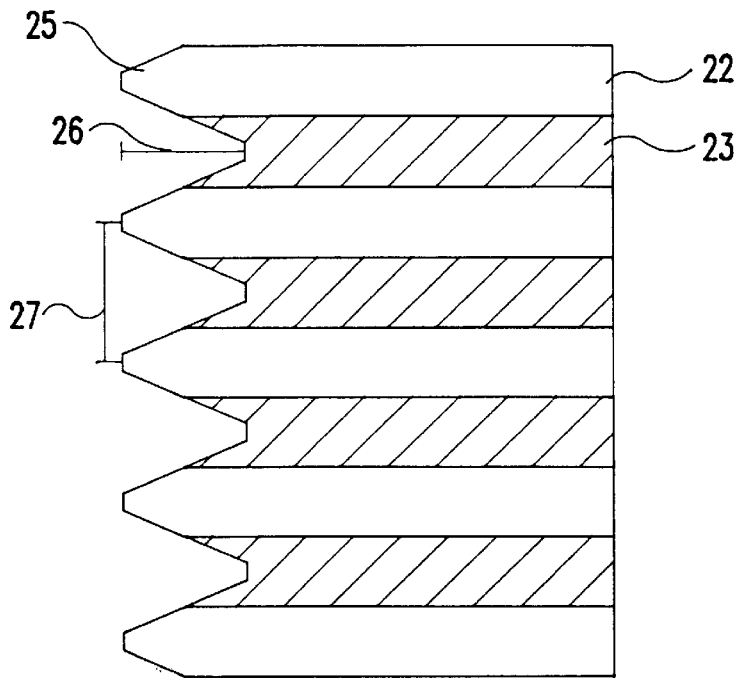
FIG. 3B shows of detail of the structure shown in FIG. 3A.

FIG. 3A shows the resulting fingered structure. In FIG. 3A, there are the substrate 21 and layers of low doped phosphorous (2% by weight) BPSG film 22 and high doped phosphorous BPSG film (6% by weight) 23 having an etch via 24. The walls of the via 24 are distinguished by fingers 25 which form as a result of the varying etch rates between the layers. FIG. 3B, an enlarged detail of the fingers shown in FIG. 3A, illustrates the depth 26 and repeat 27 dimensions of the fingers 25. Depth dimension 26 can be controlled by the dopant content. The repeat 27 distance depends on the period of layers in the BPSG and hence can be controlled by the variation of the platen rotation rate in the reactor. A rapid thermal anneal step can be implemented after wet etching to evenly distribute the B and P dopants in the BPSG.

Returning to FIG. 1, in the step shown in block 6, conformal titanium nitride is deposited as conducting film. Titanium nitride films can be formed by either conventional or plasma Electron Cyclotron Resonance plasma using $TiCl_2$ and nitrogen-based precursors and as $NH_3$ and/or $N_2$. The titanium nitride film enhances the adhesion between the oxide layer and subsequent $Ta_2O_5$ film. It also may improve the overall electrical leakage. It should be noted that other conducting, conformal film, such as TaN or CoN, can also be used for the same purpose.

In the step shown in block 6, thin (12–15 nm) conformal tantalum oxide ($Ta_2O_5$) deposition in the reactor. In addition to $Ta_2O_5$, any other conformal, nonconducting film with appropriately high dielectric constant could also be used. An alternative film which is both conformal and high dielectric constant is $SrTiO_3$. Other highly conformal dielectric constant films of the same types can be used for the same purpose. Then, in the step shown in block 6, conductive polysilicon (doped p or n-type depending on devices) is deposited. In the step shown in block 7, the polysilicon, $Ta_2O_5$, and titanium nitride conducting layer is removed with chemical mechanical polish (CMP).

Figure 4:
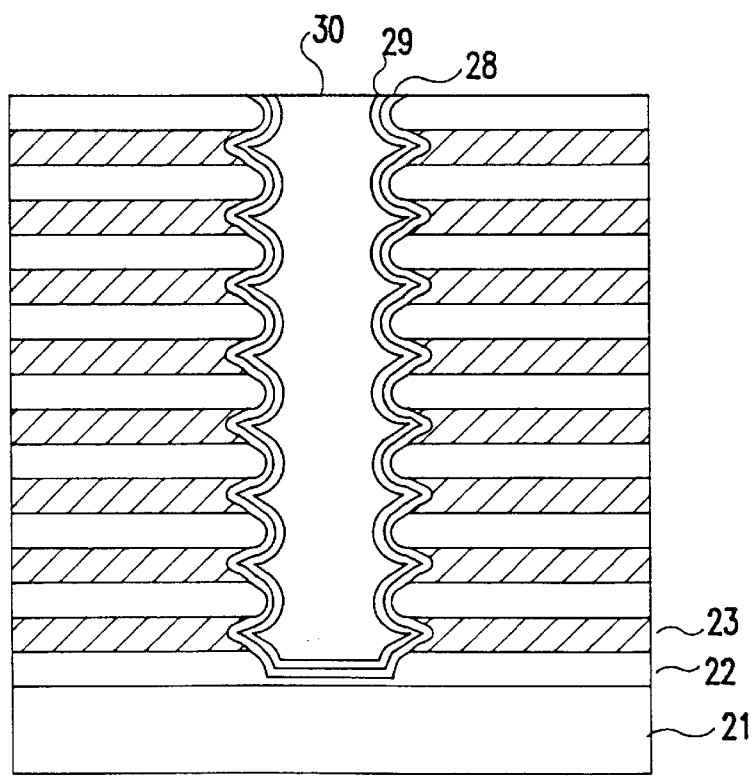
FIG. 4 is a schematic of a cross section of the structure as it appears after the eighth step of the inventive process.

The structure after the eighth step is shown in FIG. 4. Here, the substrate 21 and high 22 and low 23 dopant layers are as they were in FIG. 3A. The fingers 25 and the bottom of the via are now coated first with thin layer 28 of TiN and then with thin layer 29 of $Ta_2O_5$. The via has been filled with doped polysilicon 30.

Next, in the step shown in block 8 of FIG. 1, a partial etch is performed with wet etching back to the doped polysilicon. In the next step a thin $Ta_2O_5$/TiN film is deposited. An alternative dielectric, as previously discussed may also be used.

In the next step a chemical mechanical polish (CMP) is done to touch up and remove $Ta_2O_5$/TiN up-layer. Spin-on glass can be used to protect the lower area prior to CMP. Finally, BPSG film is plasma CVD deposited.

Figure 5:
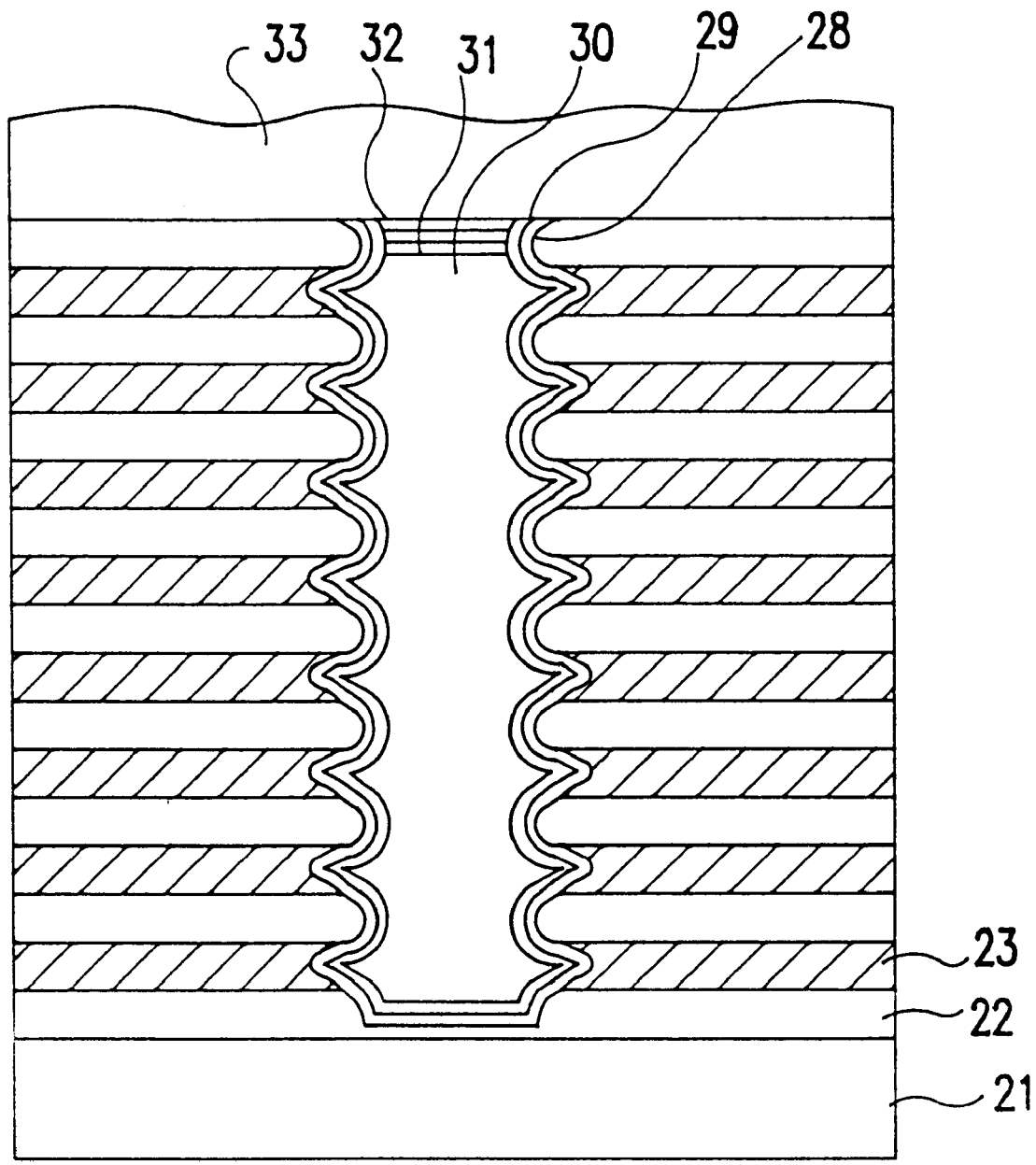
FIG. 5 is a schematic of a cross section of the structure as it appears after the final step of the inventive process.

FIG. 5 shows the structure obtained after this final step. $Ta_2O_5$/TiN layers 31 and 32 have been deposited over the doped polysilicon, and plasma BPSG 33 has been deposited over the whole structure.

After the formation of the capacitor, the electrodes can be contacted by standard techniques either from the fabricated silicon substrate or from above. These steps have to be implemented either in the fabrication of the silicon substrate before synthesis of the capacitor or in the subsequent steps leading up to the first level electrical wiring of the devices ($M_0$)

The key to the formation of fingered stacked capacitor is the wet etch selectivity between alternate deposited layers. By selecting materials that could be deposited in the same process chamber, shorter process times and better defect control can be realized.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of making a stack capacitor comprising the steps of:

providing a substrate;

depositing alternating layers of low concentration doped oxide film and high concentration doped oxide film on said substrate;

mask patterning said layers forming a via;

dry etching said layers;

selectively wet etching said layers;

depositing thin layers of a conformal, conducting film and a conformal, high dielectric constant film on a bottom and a multiplicity of sides of said via;

filling said via with dope polysilicon;

planarizing said via filled with polysilicon;

wet etching said polysilicon;

depositing thin layers of a conformal, conducting film and a conformal, high dielectric constant film over said polysilicon; and depositing borophosphosilicate glass over said layers and polysilicon.

2. A method of making a stack capacitor as in claim 1, wherein said step of depositing is chemical vapor depositing.

3. A method of making a stack capacitor as in claim 1, wherein said low doped oxide film is selected from the group consisting of borophosphosilicate glass, phosphosilicate glass, and borosilicate glass; and wherein said high doped oxide film is selected from the group consisting of borophosphosilicate glass, phosphosilicate glass, and borosilicate glass.

4. A method of making a stack capacitor as in claim 1, wherein said low doped oxide film has a concentration range of 0.5 to 1% by weight.

5. A method of making a stack capacitor as in claim 1, wherein said high doped oxide film has a concentration range of 3 to 10% by weight.

6. A method of making a stack capacitor as in claim 1, wherein said low doped oxide film has a thickness of 1 to 1000 nm.

7. A method of making a stack capacitor as in claim 1, wherein said high doped oxide film has a thickness of 1 to 1000 nm.

8. A method of making a stack capacitor as in claim 1, wherein said conducting, conformal film is selected from the group consisting of TiN, TaN, and CoN; and wherein said conformal, high dielectric constant film is selected from the group consisting of $TaO_5$ and $SrTiO_3$.

9. A method of making a stack capacitor as in claim 1, wherein said conducting, conformal film is TiN; and wherein said conformal, high dielectric constant film is $Ta_2O_5$.

* * * * *